United States Patent
Kasorla et al.

(10) Patent No.: US 9,502,120 B2
(45) Date of Patent: *Nov. 22, 2016

(54) PROGRAMMING MEMORY CELLS DEPENDENT UPON DISTORTION ESTIMATION

(71) Applicant: Apple Inc., Cupertino, CA (US)

(72) Inventors: Yoav Kasorla, Kfar Netar (IL); Naftali Sommer, Rishon Le-Zion (IL); Eyal Gurgi, Petah-Tikva (IL); Micha Anholt, Tel Aviv (IL)

(73) Assignee: Apple Inc, Cupertino, CA (US)

( * ) Notice: Subject to any disclaimer, the term of this patent is extended or adjusted under 35 U.S.C. 154(b) by 19 days.

This patent is subject to a terminal disclaimer.

(21) Appl. No.: 14/318,876

(22) Filed: Jun. 30, 2014

(65) Prior Publication Data

US 2014/0347924 A1     Nov. 27, 2014

Related U.S. Application Data

(63) Continuation of application No. 13/192,501, filed on Jul. 28, 2011, now Pat. No. 8,767,459.

(60) Provisional application No. 61/369,667, filed on Jul. 31, 2010, provisional application No. 61/475,241, filed on Apr. 14, 2011.

(51) Int. Cl.
| | |
|---|---|
| *G11C 16/10* | (2006.01) |
| *G11C 27/00* | (2006.01) |
| *G06F 11/10* | (2006.01) |
| *G11C 11/56* | (2006.01) |
| *G11C 16/04* | (2006.01) |
| *G11C 16/12* | (2006.01) |

(52) U.S. Cl.
CPC ........... *G11C 16/10* (2013.01); *G06F 11/1048* (2013.01); *G11C 11/5628* (2013.01); *G11C 16/0483* (2013.01); *G11C 27/005* (2013.01); *G11C 16/04* (2013.01); *G11C 16/12* (2013.01); *G11C 2211/5647* (2013.01); *G11C 2211/5648* (2013.01)

(58) Field of Classification Search
CPC ................. G11C 16/10; G11C 16/0483; G11C 27/005; G11C 11/5628; G11C 2211/5648; G11C 16/12; G11C 16/04; G11C 2211/5647; G06F 11/1048

See application file for complete search history.

(56) References Cited

U.S. PATENT DOCUMENTS

| | | | |
|---|---|---|---|
| 7,173,859 | B2 | 2/2007 | Hemink |
| 7,243,277 | B2 | 7/2007 | Wu et al. |
| 7,518,914 | B2 | 4/2009 | Han |
| 7,742,335 | B2 | 6/2010 | Aritome |
| 8,223,555 | B2 | 7/2012 | Kim et al. |
| 8,259,497 | B2 | 9/2012 | Shalvi et al. |
| 8,261,158 | B2 | 9/2012 | Thatcher et al. |

(Continued)

*Primary Examiner* — J. H. Hur
(74) *Attorney, Agent, or Firm* — Meyertons, Hood, Kivlin, Kowert & Goetzel, P.C.

(57) ABSTRACT

A method for data storage includes accepting data for storage in an array of memory cells, which are arranged in rows associated with respective word lines. Data is stored in one or more memory cells of the array using one or more programming levels. In response to a determination that a first memory cell of the one or more memory cells is subject to distortion, a second memory cell may be programmed to a predetermined programming level.

20 Claims, 8 Drawing Sheets

(56) References Cited

U.S. PATENT DOCUMENTS

| | | |
|---|---|---|
| 8,443,259 B2 | 5/2013 | Thatcher et al. |
| 8,634,250 B2 | 1/2014 | Haratsch et al. |
| 8,645,794 B1 * | 2/2014 | Meir ................... G11C 16/10 365/185.03 |
| 8,767,459 B1 * | 7/2014 | Kasorla ................ G11C 16/10 365/184 |
| 2004/0088502 A1 * | 5/2004 | Frayer ................ G06F 12/0246 711/156 |
| 2004/0190357 A1 * | 9/2004 | Scheuerlein ......... G11C 7/1006 365/222 |
| 2005/0024939 A1 * | 2/2005 | Chen ................... G11C 11/5628 365/185.17 |
| 2006/0020996 A1 | 1/2006 | Takagi et al. |
| 2006/0028875 A1 * | 2/2006 | Avraham ............... G11C 16/12 365/185.24 |
| 2006/0028877 A1 | 2/2006 | Meir |
| 2008/0019188 A1 * | 1/2008 | Li .......................... G11C 8/10 365/185.22 |
| 2008/0084740 A1 | 4/2008 | Kim et al. |
| 2008/0235441 A1 * | 9/2008 | Sherman .............. G06F 1/3203 711/103 |
| 2009/0027960 A1 * | 1/2009 | Sarin .................... G11C 11/5621 365/185.03 |
| 2013/0322169 A1 | 12/2013 | Goss et al. |

* cited by examiner

PROGRAMMING MEMORY CELLS DEPENDENT UPON DISTORTION ESTIMATION

CROSS-REFERENCE TO RELATED APPLICATIONS

This application is a continuation of U.S. patent application Ser. No. 13/192,501, filed Jul. 28, 2011, which claims the benefit of U.S. Provisional Patent Application 61/369,667, filed Jul. 31, 2010, and U.S. Provisional Patent Application 61/475,241, filed Apr. 14, 2011, whose disclosures are incorporated herein by reference. This application is related to a U.S. patent application entitled "Data storage in analog memory cells using a non-integer number of bits per cell", filed on even date, whose disclosure is incorporated herein by reference.

FIELD OF THE INVENTION

Embodiments described herein are related to the field of data storage, and particularly to methods and systems for storing data in analog memory cells.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. This analog value represents the information stored in the cell. In Flash memories, for example, each analog memory cell holds a certain amount of electrical charge. The range of possible analog values is typically divided into intervals, each interval corresponding to one or more data bit values. Data is written to an analog memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume two possible programming levels. Higher-density devices, often referred to as Multi-Level Cell (MLC) devices, store two or more bits per memory cell, i.e., can be programmed to assume more than two possible programming levels.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate," Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the $24^{th}$ International Conference on Microelectronics (MIEL), Nis, Serbia and Montenegro, May 16-19, 2004, volume 1, pages 377-384, which is incorporated herein by reference.

Some storage schemes store data at a density having a non-integer number of bits per memory cell. For example, U.S. Pat. No. 7,071,849, whose disclosure is incorporated herein by reference, describes fractional-bit systems that allow increments of the number of states per cell by as little as one between product generations. Because the number of states per cell is not an integer power of two, the number of bits per cell takes a fractional value. Cells are typically decoded in unit of word, and the system efficiency can be optimized by adjusting the word-width.

As another example, U.S. Pat. No. 6,646,913, whose disclosure is incorporated herein by reference, describes a method for storing and reading data in a multilevel non-volatile memory having a memory array formed by a plurality of memory cells. Each of the memory cells stores a number of bits that is not an integer power of two. In this way, one data byte is stored in a non-integer number of memory cells. The managing method includes storing, in the same clock cycle, a data word formed by a plurality of bytes, by programming a preset number of adjacent memory cells. Reading is performed by reading the stored data word in the same clock cycle.

SUMMARY OF THE INVENTION

An embodiment of the present invention that is described herein provides a method for data storage. The method includes accepting data for storage in an array of analog memory cells, which are arranged in rows associated with respective word lines. At least a first page of the data is stored in a first row of the array, and at least a second page of the data is stored in a second row of the array, having a different word line from the first row. After storing the first and second pages, a third page of the data is stored jointly in the first and second rows.

In some embodiments, storing the third page includes selecting respective programming levels at least for one memory cell in the first row and one memory cell in the second row based on a given bit value of the third page. In an embodiment, storing the third page includes storing a given bit of the third page by: selecting a first programming level for a first memory cell in the first row based on the given bit of the third page and on a corresponding first bit of the first page; selecting a second programming level for a second memory cell in the second row based on the given bit of the third page and on a corresponding second bit of the second page; and programming the first and second memory cells to the selected first and second programming levels, respectively.

In another embodiment, storing the third page includes storing a given bit of the third page by: selecting a first programming level for a first memory cell in the first row, and a second programming level for a second memory cell in the second row, based on the given bit of the third page, on a corresponding first bit of the first page and on a corresponding second bit of the second page; and programming the first and second memory cells to the selected first and second programming levels, respectively. In yet another embodiment, storing the first, second and third pages includes executing respective, different first, second and third page programming commands.

In a disclosed embodiment, the method includes performing at least one storage operation in a third row, which neighbors the first row or the second row, after storing the first page and before storing the third page. In still another embodiment, storing the third page includes programming the memory cells in the first and second row using a number of programming levels that is not an integer power of two. In an embodiment, each of the memory cells is programmable to a respective set of programming levels, and storing the third page includes selecting the programming levels at least for a first memory cell in the first row and a second memory cell in the second row from a partial subset of possible combinations of the programming levels of the first and second memory cells.

There is additionally provided, in accordance with an embodiment of the present invention, a method for data storage including accepting data for storage in an array of analog memory cells, which are arranged in rows associated with respective word lines. Bit values of the data are mapped to programming levels of the analog memory cells, such that at least one bit value is encoded by the programming levels of at least two analog memory cells belonging to different, respective word lines of the array. The data is stored by programming the analog memory cells to the programming levels mapped to the bit values.

In some embodiments, accepting the data includes accepting at least first, second and third pages, and mapping the bit values includes mapping corresponding bit values of the first and third pages to respective programming levels for the memory cells in a first word line, and mapping corresponding bit values of the second and third pages to respective programming levels for the memory cells in a second word line, different from the first word line. In an embodiment, storing the data includes programming the analog memory cells belonging to the different word lines using respective, different page programming commands. In another embodiment, a number of the programming levels is not an integer power of two.

There is also provided, in accordance with an embodiment of the present invention, a method for data storage including accepting and buffering second data for storage in an array of analog memory cells, which are arranged in rows associated with respective word lines and in which first data is potentially already stored. The buffered second data is stored in a given row of the array by: assessing a first size of the first data that is potentially already stored in the given row; assessing a second size of the second data that is buffered for storage; selecting a programming operation from among multiple predefined programming operations depending on the first and second sizes; and storing the buffered second data in the given row using the selected programming operation.

In some embodiments, assessing the first and second sizes includes identifying the first and second sizes at a granularity of half a page of the data. In a disclosed embodiment, at least one of the predefined programming operations stores a full page of the data in the given row when the given row already holds half a page of the data.

There is further provided, in accordance with an embodiment of the present invention, apparatus for data storage including a memory and storage circuitry. The memory includes an array of analog memory cells that are arranged in rows associated with respective word lines. The storage circuitry is configured to accept data for storage in the array, to store at least a first page of the data in a first row of the array, to store at least a second page of the data in a second row of the array, having a different word line from the first row, and, after storing the first and second pages, to store a third page of the data jointly in the first and second rows.

There is moreover provided, in accordance with an embodiment of the present invention, apparatus for data storage including a memory and storage circuitry. The memory includes an array of analog memory cells that are arranged in rows associated with respective word lines. The storage circuitry is configured to accept data for storage in the array, to map bit values of the data to programming levels of the analog memory cells, such that at least one bit value is encoded by the programming levels of at least two analog memory cells belonging to different, respective word lines of the array, and to store the data by programming the analog memory cells to the programming levels mapped to the bit values.

There is additionally provided, in accordance with an embodiment of the present invention, apparatus for data storage including a memory and storage circuitry. The memory includes an array of analog memory cells that are arranged in rows associated with respective word lines. The storage circuitry is configured to accept and buffer second data for storage in the array while first data is potentially already stored in the array, and to store the buffered second data in a given row of the array by assessing a first size of the first data that is potentially already stored in the given row, assessing a second size of the second data that is buffered for storage, selecting a programming operation from among multiple predefined programming operations depending on the first and second sizes, and storing the buffered second data in the given row using the selected programming operation.

The present invention will be more fully understood from the following detailed description of the embodiments thereof, taken together with the drawings in which:

DETAILED DESCRIPTION OF EMBODIMENTS

Overview

Figure 1:
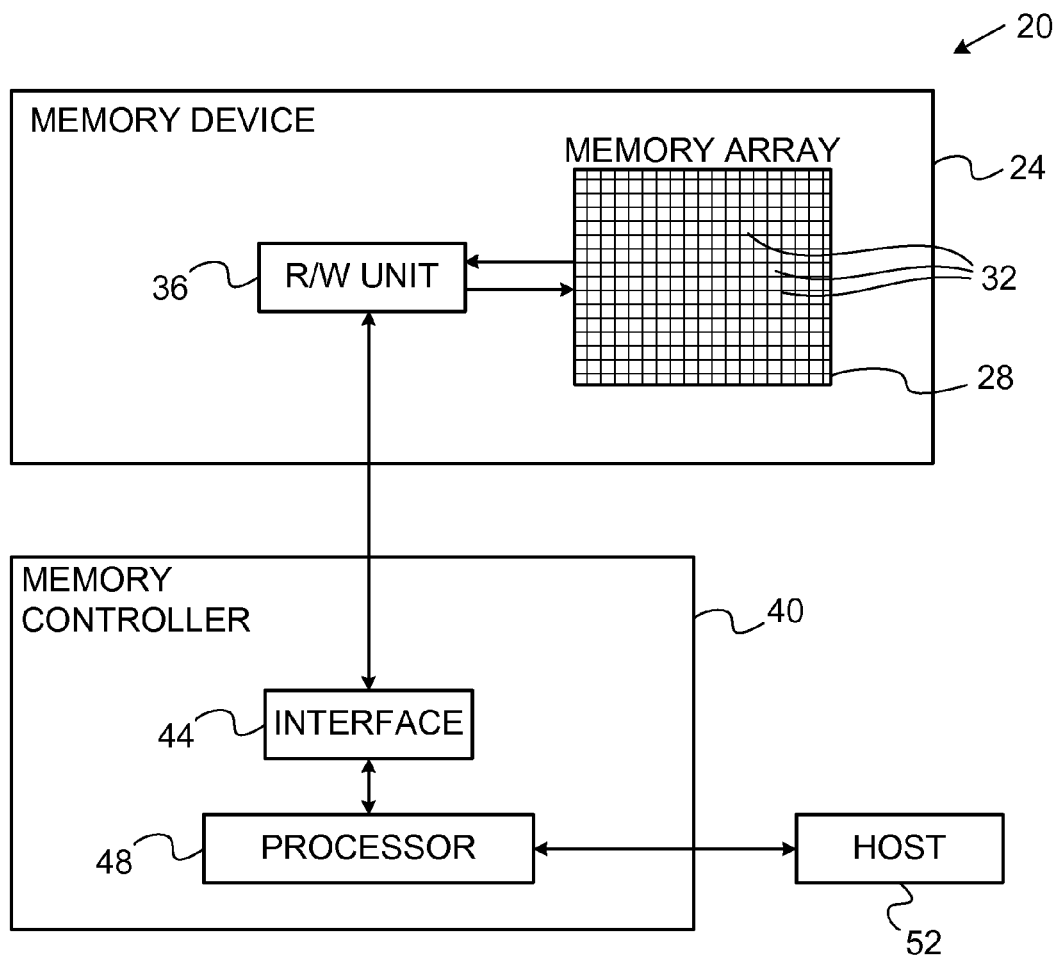
FIG. 1 is a block diagram that schematically illustrates a memory system, in accordance with an embodiment of the present invention.

Storing data in analog memory cells at a non-integer number of bits per memory cell means that the storage process is not constrained to use a number of programming levels that is an integer power of two. The finer granularity in defining the programming levels enables better exploitation of the capacity of the memory cells.

On the other hand, storing data in this manner sometimes collides with operating conventions of analog memory devices, such as maintaining a standard page size, storing multiple separate pages in each word line, and reducing interference by programming word lines in a gradual, alternating order. Storage at a non-integer number of bits per cell may also increase the size of memory buffers used in the storage process.

Embodiments of the present invention provide improved methods and systems for data storage, which reduce or eliminate the performance degradation that is conventionally associated with storage at a non-integer number of bits per memory cell.

In some embodiments, a memory system accepts data pages for storage in an array of analog memory cells. The system stores a first page in one word line (row) of the array, a second page in another word line, and a third page jointly in the two word lines. In a typical embodiment, joint storage means that each bit of the third page determines the programming levels in a respective pair of memory cells, one memory cell in each word line. These techniques enable the system to increase storage density while maintaining a standard page size. This scheme may be applied not only in storing three pages in two word lines as in the above example, but also to storing larger numbers of pages per word line.

In other disclosed embodiments, the memory system selects how to store data in a given word line depending on (i) the size of the data that is already stored in the given word line and (ii) the size of the data that is currently buffered and pending for storage. Based on these two data sizes, the system selects a programming operation from a set of possible operations, and stores the pending data using the selected operation. The programming operation may involve storing a non-integer number of bits per cell in the word line. In an example embodiment, the data sizes are assessed at a granularity of half a page. In at least one of the possible programming operations, a full page of data is programmed in a word line that already holds half a page. These techniques can be combined with alternating word line programming orders, so as to reduce interference.

In some disclosed embodiments, the memory system stores data in a group of analog memory cells using a two-phase process. In the first phase, the system programs the memory cells in the group to a set of initial programming levels, whose size is typically an integer power of two. In the second phase, the system stores additional data, but only in those memory cells that were programmed in the first phase to certain specific initial programming levels in a certain predefined partial subset of the initial programming levels.

The second phase thus produces one or more additional programming levels that are different from the initial programming levels. The aggregate number of the initial and additional programming levels is typically not an integer power of two. Several example programming and readout schemes of this sort are described. These techniques approach the theoretical capacity of the memory cells, and at the same time enable efficient interference mitigation and require only modest buffering.

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules (e.g., "disk-on-key" or "Flash drive" devices), Solid State Disks (SSD), digital cameras, music and other media players and/or any other system or device in which data is stored and retrieved.

System 20 comprises a memory device 24, which stores data in a memory cell array 28. The memory array comprises multiple analog memory cells 32. In the context of the present patent application and in the claims, the term "analog memory cell" is used to describe any memory cell that holds a continuous, analog value of a physical parameter, such as an electrical voltage or charge. Array 32 may comprise solid-state analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells. Although the embodiments described herein refer mainly to analog memory, the disclosed techniques may also be used with various other memory types.

The charge levels stored in the cells and/or the analog voltages or currents written into and read out of the cells are referred to herein collectively as analog values, storage values or analog storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell. The techniques described herein mainly address storage densities of a non-integer number of bits per memory cell, i.e., a number of programming levels per cell that is not an integer power of two.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells 32 into digital samples having a resolution of one or more bits. Data is typically written to and read from the memory cells in groups that are referred to as pages. In some embodiments, the R/W unit can erase a group of cells 32 by applying one or more negative erasure pulses to the cells.

The storage and retrieval of data in and out of memory device 24 is performed by a memory controller 40. Memory controller 40 comprises an interface 44 for communicating with memory device 24, and a processor 48. The disclosed techniques can be carried out by memory controller 40, by R/W unit 36, or both. Thus, in the present context, memory controller 40 and R/W unit 36 are referred to collectively as storage circuitry that carries out the disclosed techniques.

Memory controller 40 communicates with a host 52, for accepting data for storage in the memory device and for outputting data retrieved from the memory device. Memory controller 40 may be implemented in hardware, e.g., using one or more Application-Specific Integrated Circuits (ASICs) or Field-Programmable Gate Arrays (FPGAs). Alternatively, the memory controller may comprise a microprocessor that runs suitable software, or a combination of hardware and software elements.

The configuration of FIG. 1 is an example system configuration, which is shown purely for the sake of conceptual clarity. Any other suitable memory system configuration can also be used. For example, although the example of FIG. 1 shows a single memory device, in alternative embodiments memory controller 40 may control multiple memory devices 24. Elements that are not necessary for understanding the principles of the present invention, such as various interfaces, addressing circuits, timing and sequencing circuits and debugging circuits, have been omitted from the figure for clarity.

In the example system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 44 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, memory cells 32 are arranged in multiple rows and columns, and each memory cell comprises a floating-gate transistor. The gates of the transistors in each row are connected by word lines, and the sources of the transistors in each column are connected by bit lines. In the present context, the term "row" is used in the conventional sense to mean a group of memory cells that are fed by a common word line, and the term "column" means a group of memory cells fed by a common bit line. The terms "row" and "column" do not connote a certain physical orientation of the memory cells relative to the memory device. The memory array is typically divided into multiple memory pages, i.e., groups of memory cells that are programmed and read simultaneously.

In some embodiments, memory pages are sub-divided into sectors. Pages may be mapped to word lines in various manners. Each word line may store one or more pages. A given page may be stored in all the memory cells of a word line, or in a subset of the memory cells (e.g., the odd-order or even-order memory cells).

Erasing of cells is usually carried out in blocks that contain multiple pages. Typical memory devices may comprise thousands of erasure blocks. In a typical two-bit-per-cell MLC device, each erasure block is on the order of 32 word lines, each comprising several tens of thousands of cells. Each word line of such a device is often partitioned into four pages (odd/even order cells, least/most significant bit of the cells). Three-bit-per cell devices having 32 word lines per erasure block would have 192 pages per erasure block, and four-bit-per-cell devices would have 256 pages per block. Alternatively, other block sizes and configurations can also be used. Some memory devices comprise two or more separate memory cell arrays, often referred to as planes. Since each plane has a certain "busy" period between successive write operations, data can be written alternately to the different planes in order to increase programming speed.

Data Storage Across Word Lines Using a Non-Integer Number of Bits Per Memory Cell In some embodiments, system 20 stores data in memory cells 32 of array 28 at a storage density of a non-integer number of bits per memory cell, i.e., using a number of programming levels that is not an integer power of two. Such programming schemes enable the system to better exploit the capacity of the memory cells. For example, certain memory cells may not enable reliable storage using four programming levels per cell (2 bits/cell) but do enable reliable storage using three programming levels per cell (1.5 bits/cell).

Storage using a non-integer number of bits per cell sometimes collides with operating conventions of analog memory devices, such as standard page size, storage of multiple independently-programmed pages in each word line, or programming orders of word lines for reducing interference. The disclosed techniques resolve this apparent contradiction.

In some embodiments described below, system 20 achieves a non-integer number of bits per cell by jointly defining the programming levels of the memory cells across multiple word lines. In other words, when mapping the data bit values to memory cell programming levels, at least one bit value is encoded by the programming levels of at least two analog memory cells belonging to different, respective word lines. In a typical embodiment, at least a first page is stored in memory cells of one word line, at least a second page is stored in memory cells of another word line, and, at a later point in time, a third page is stored jointly in memory cells of both word lines.

Joint mapping of bit values to programming levels for corresponding memory cells in different word lines (rather than for multiple memory cells in the same word line) can be implemented using simple logic hardware or software while preserving the storage conventions of the memory device. Typically, different word lines are programmed using different page programming commands. Thus, the memory cells whose programming levels are affected by this joint mapping are typically programmed using different page programming commands.

Figure 2:
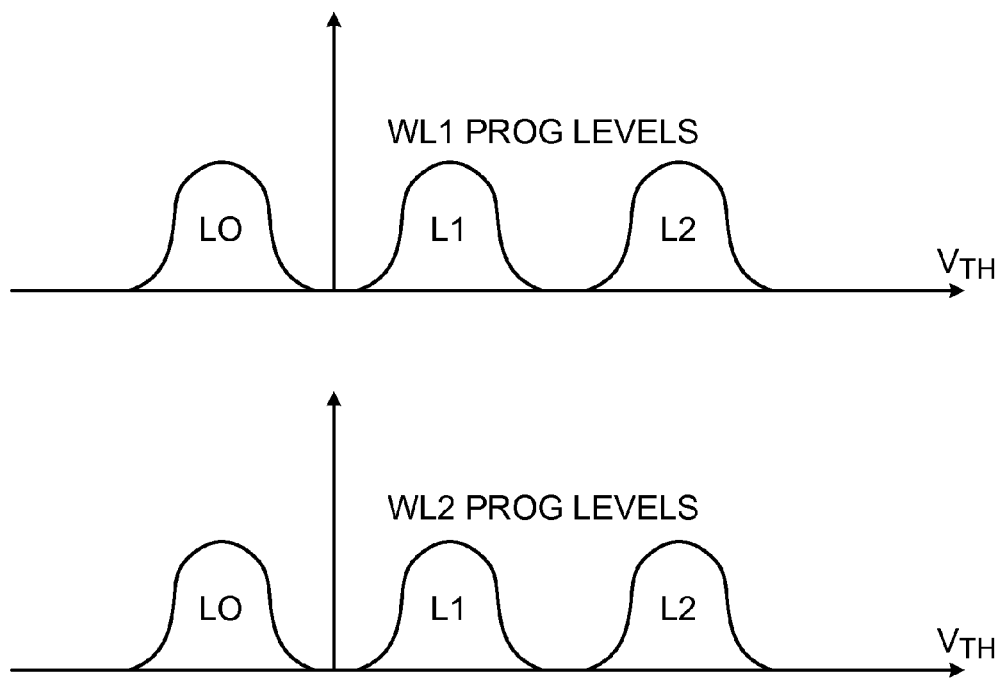
FIG. 2 is a graph showing programming levels of memory cells belonging to two word lines, in accordance with an embodiment of the present invention.
Figure 3:
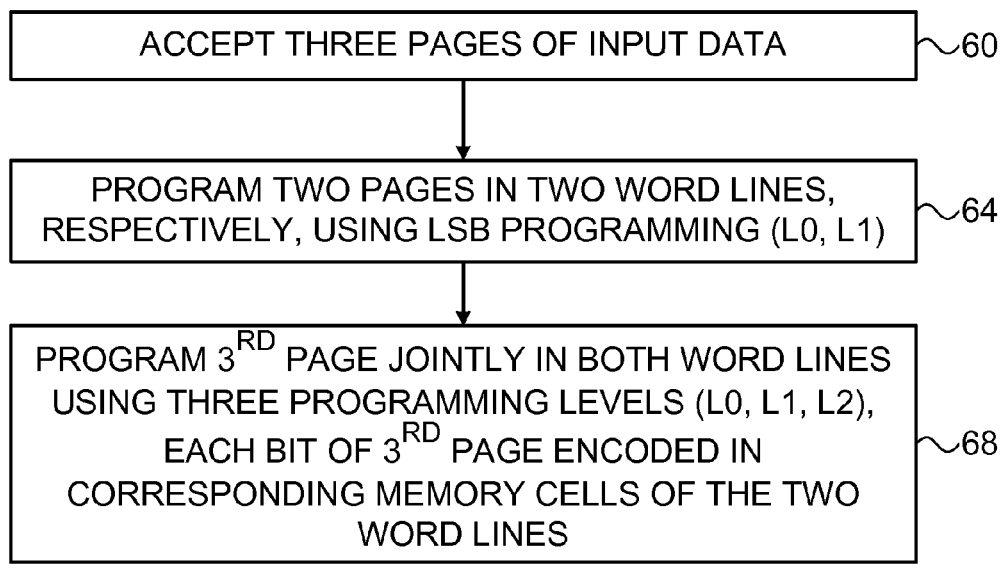
FIG. 3 is a flow chart that schematically illustrates a method for storing three data pages in memory cells belonging to two word lines, in accordance with an embodiment of the present invention.
Figure 4:
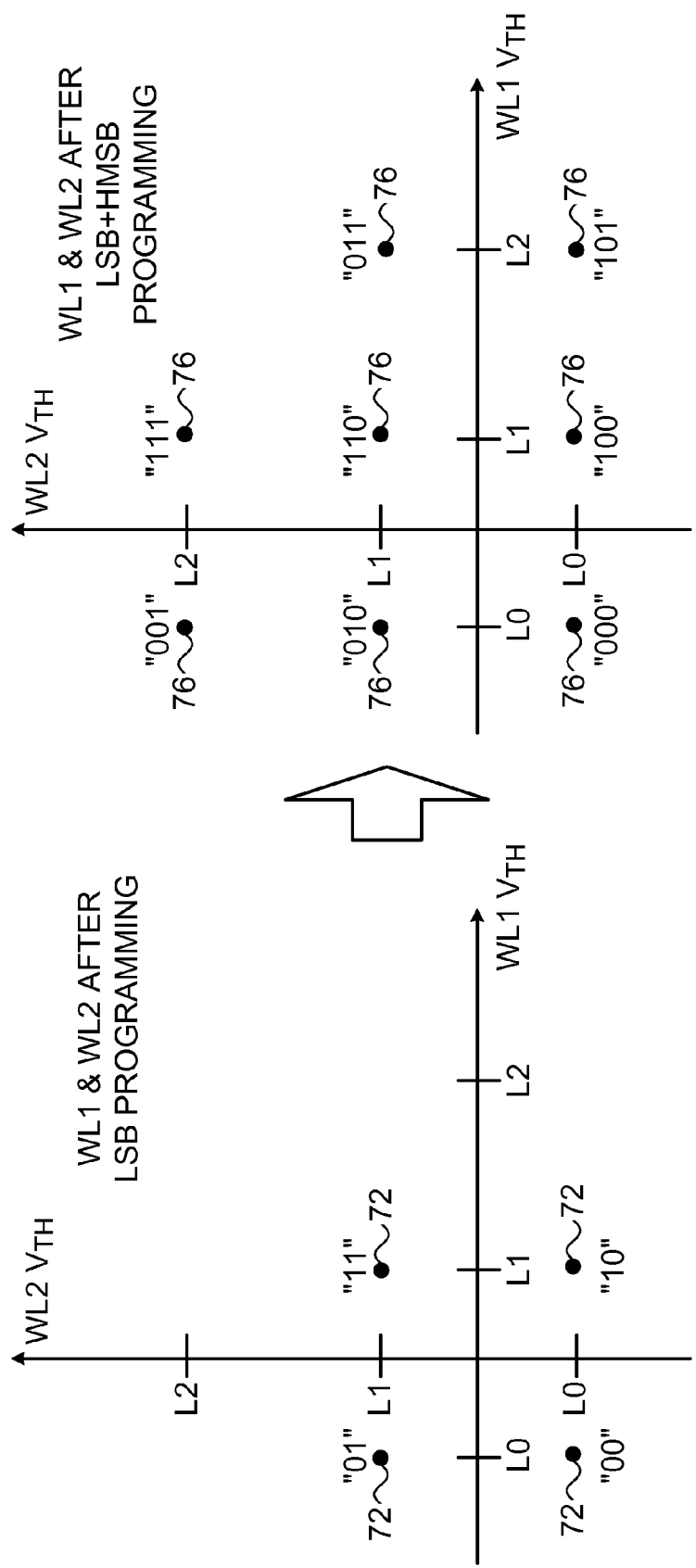
FIG. 4 is a diagram that schematically illustrates a process of storing three data pages in memory cells belonging to two word lines, in accordance with an embodiment of the present invention.

FIGS. 2-4 below show an example embodiment in which three data pages are stored in the memory cells of two word lines of array 28, using three programming levels per cell (1.5 bits/cell).

FIG. 2 is a graph showing programming levels of memory cells belonging to two word lines, in accordance with an embodiment of the present invention. The two word lines in question are denoted WL1 and WL2. Each memory cell can be programmed to one of three possible programming levels denoted L0, L1 and L2. L0 also serves as the erased level, i.e., erased memory cells are set to this level. Each of the three programming levels occupies a respective range of threshold voltages ($V_{TH}$) as seen in the figure. Typically although not necessarily, L0 occupies a range of negative threshold voltages while L1 and L2 occupy ranges of positive threshold voltages.

System 20 stores three data pages in two word lines of this sort. A first data page is stored in WL1, one bit in each memory cell, using levels L0 and L1. A second data page is stored in WL2 in a similar manner, one bit in each memory cell, using levels L0 and L1. A third data page is stored jointly in WL1 and WL2, one bit in every pair of corresponding memory cells in the two word lines, using all three levels L0, L1 and L2.

FIG. 3 is a flow chart that schematically illustrates a method for storing three data pages in memory cells belonging to two word lines, in accordance with an embodiment of the present invention. The method begins with memory controller 40 accepting three data pages for storage, at an input step 60. The memory controller stores the first and second data pages in word lines WL1 and WL2, respectively, at a first storage step 64. This storage step uses only programming levels L0 and L1. In an example embodiment, one data bit is stored in each memory cell, such that "0" bit value is mapped to level L0 and "1" bit value is mapped to level L1. This programming step is referred to herein as Least Significant Bit (LSB) programming of the two word lines.

The memory controller then programs the third data page jointly in the memory cells of the two word lines, at a second programming step 68. This programming step is referred to herein as Half Most Significant Bit (HMSB) programming of the two word lines. After LSB programming and before HMSB programming, each memory cell in WL1 and WL2 is already LSB-programmed using levels L0 and L1. The memory controller now re-programs word lines WL1 and WL2, using all three programming levels L0 . . . L2, such that each bit of the third data page defines the programming levels in a respective pair of corresponding memory cells in WL1 and WL2.

In this scheme, the programming level of the $n^{th}$ memory cell of WL1 depends on the value of the $n^{th}$ bit of the first data page (which was already programmed at step 64 above) and on the value of the $n^{th}$ bit of the third data page. The programming level of the $n^{th}$ memory cell of WL2 depends on the value of the $n^{th}$ bit of the second data page (which was programmed at step 64 above) and on the value of the $n^{th}$ bit of the third data page. Thus, the value of the $n^{th}$ bit of the third data page determines the programming levels of both the $n^{th}$ memory cell of WL1 and the $n^{th}$ memory cell of WL2.

When implementing the programming scheme of FIGS. 2 and 3, various types of mapping between bit values and programming levels can be used for the LSB and HMSB programming steps. Typically, however, the threshold voltages of analog memory cells 32 can only be increased when carrying out the HMSB programming. Thus, the HMSB programming scheme is typically permitted only to leave a memory cell at its present programming level or shift it to a higher programming level.

In alternative embodiments, the mapping of the bit values of the third data page to the programming levels of WL1 and WL2 is not separable. In other words, the programming level of the $n^{th}$ memory cells in both WL1 and WL2 depend on (i) the value of the $n^{th}$ bit of the first data page, (ii) the value of the $n^{th}$ bit of the second data page, and (iii) the value of the $n^{th}$ bit of the third data page.

FIG. 4 is a diagram that schematically illustrates an example mapping of bit values to programming levels in the LSB and HMSB programming steps, in accordance with an embodiment of the present invention. The left hand side of the figure shows the threshold voltages (and corresponding programming levels) of the memory cells in WL1 and WL2 after LSB programming. For each pair of corresponding memory cells in WL1 and WL2 (i.e., the $n^{th}$ memory cell in WL1 and the $n^{th}$ memory cell in WL2), the threshold voltages of the two memory cells are shown as points 72 in a two-dimensional space. The horizontal axis shows the threshold voltage of the memory cell belonging to WL1, and the vertical axis shows the threshold voltage of the memory cell belonging to WL2.

This example mapping is defined by the following table:

| $1^{st}$ Page bit value | $2^{nd}$ page bit value | WL1 cell level | WL2 cell level |
| --- | --- | --- | --- |
| 0 | 0 | L0 | L0 |
| 0 | 1 | L0 | L1 |
| 1 | 0 | L1 | L0 |
| 1 | 1 | L1 | L1 |

As can be seen in the table, the first and second data pages are stored independently into WL1 and WL2, respectively.

The right hand side of FIG. 4 shows the threshold voltages (and corresponding programming levels) of the memory cells in WL1 and WL2 after LSB and HMSB programming. At this stage, the bits of the third data page are programmed into respective pairs of corresponding memory cells in WL1 and WL2. The threshold voltages of the pairs of memory cells are shown as points 76 in the two-dimensional space.

The mapping of bit values to programming levels is defined by the following table:

| | $3^{rd}$ page bit | |
| --- | --- | --- |
| {$1^{st}$ page bit, $2^{nd}$ page bit} | "0" | "1" |
| "00" | {L0, L0} | {L0, L2} |
| "01" | {L0, L1} | {L2, L1} |
| "10" | {L1, L0} | {L2, L0} |
| "11" | {L1, L1} | {L1, L2} |

The table gives the programming levels in the $n^{th}$ pair of corresponding WL1 and WL2 memory cells, as a function of the $n^{th}$ bit of the first, second and third data pages. When retrieving data from the memory cells, the three bit values can be read from a pair of WL1 and WL2 memory cells using the following inverse mapping:

| WL1 cell level | WL2 cell level | | |
| --- | --- | --- | --- |
| | L0 | L1 | L2 |
| L0 | "000" | "010" | "001" |
| L1 | "100" | "110" | "111" |
| L2 | "101" | "011" | Unused |

Typically, R/W unit 36 reads the three bit values from a pair of WL1 and WL2 memory cells by comparing the threshold values of the memory cells to certain read thresholds. When using the above-described mapping, the bit values can be recovered using the following threshold comparisons:

$LSB1=Cell1>X\&\sim([Cell1>Y\&Cell2>X])$ $LSB2=Cell2>X\&\sim([Cell1<X\&Cell2>Y])$ $MSB=Cell1>Y|Cell2>Y$ wherein LSB1 and LSB2 denote the bit values of the first and second data pages, respectively, MSB denotes the bit value of the third data page, Cell1 and Cell2 denote the threshold voltages of the WL1 and WL2 cells, respectively, X denotes the read threshold that differentiates between programming levels L0 and L1, Y denotes the read threshold that differentiates between programming levels L1 and L2, and &, | and ~ denote logical AND, OR and NOT operations, respectively.

In the present example, each individual data page can be read using two or three comparisons, i.e., two or three sense operations. All three data pages can be read using four comparisons i.e., four sense operations (two sense operations for each word line, one at threshold X and the other at threshold Y).

The mapping of bit values to programming levels shown in FIG. 4 is depicted purely by way of example. In alternative embodiments, any other suitable mapping can be used. The mapping can be selected depending on various criteria, such as, for example, minimizing the usage of level L2 in order to reduce the stress on the memory cells, or minimizing interference between word lines. Another example criterion is to choose the mapping as close as possible to Gray mapping, i.e., to minimize the number of bit differences between neighboring points 76 in the right-hand-side diagram of FIG. 4. Such a mapping would reduce bit error rate during data readout. The scheme of FIGS. 2-4 can be used with various page sizes. In an example embodiment each page comprises 8192 bytes (65536 bits), although any other suitable page size can be used in alternative embodiments.

The programming scheme of FIGS. 2-4 is an example scheme that is chosen purely for the sake of conceptual clarity. Alternatively, any other suitable programming scheme, in which at least a given bit value defines the programming levels of at least two memory cells belonging to different word lines, can be used. For example, a given bit value may define the programming levels of multiple memory cells belonging to more than two word lines. More generally, programming schemes that jointly map n bit values into m word lines can also be used.

Figure 10:
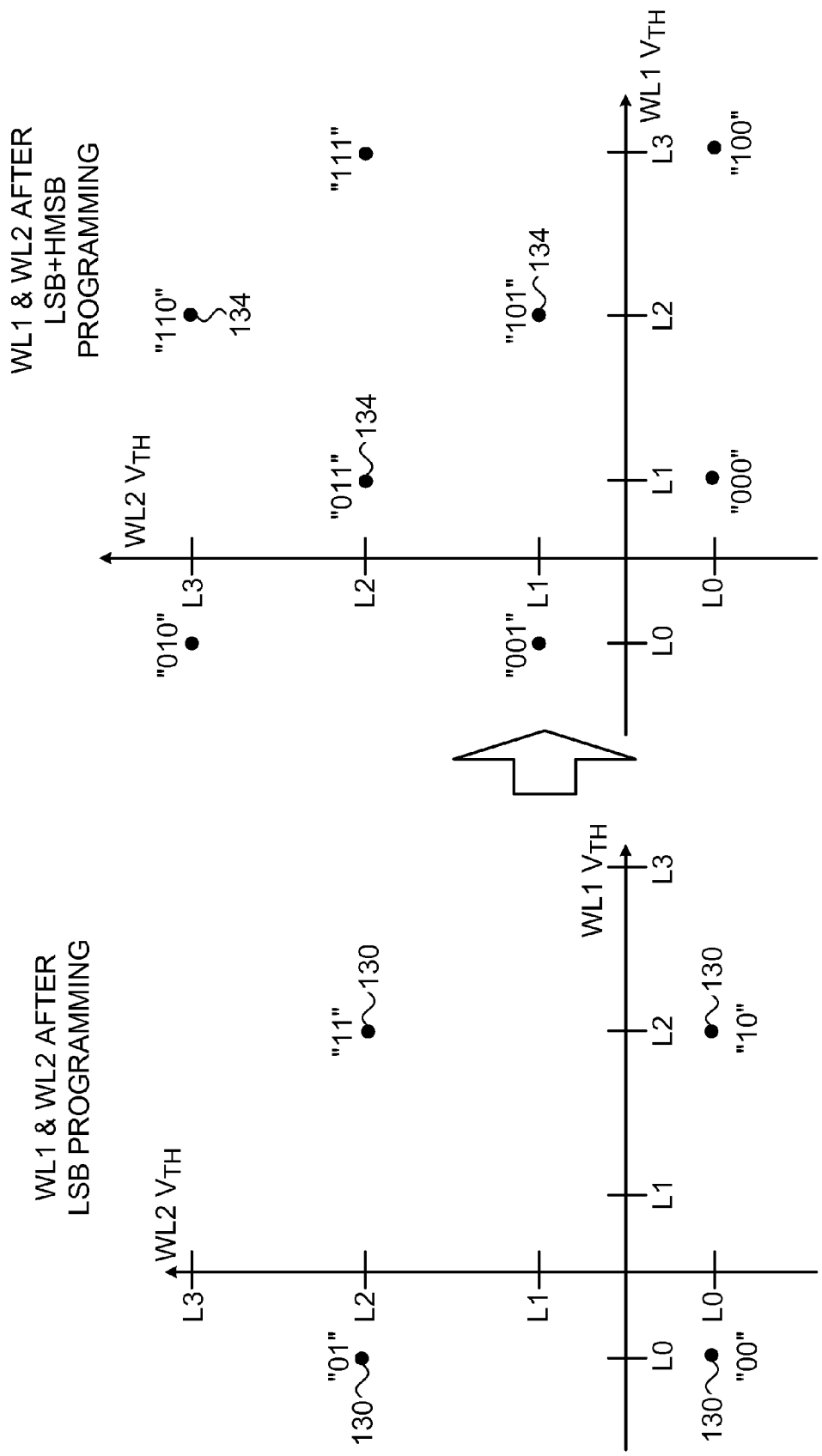
FIG. 10 is a diagram that schematically illustrates a process of storing three data pages in memory cells belonging to two word lines, in accordance with an alternative embodiment of the present invention.

In the example of FIGS. 2-4 the data is stored at a density of 1.5 bits/cell using a set of three programming levels. In alternative embodiments, any other suitable storage density and any other suitable number of programming levels can be used. An alternative programming scheme is shown in FIG. 10 further below. As yet another example, an alternative programming scheme may be defined with a set of six programming levels. Using such a scheme, a total of five data pages can be programmed into two word lines. The first four data pages are programmed using four programming levels, two pages into each word line. The fifth page is programmed jointly into the two word lines using all six programming levels.

In some embodiments, for a given pair of word lines, the HMSB programming (step 68 of FIG. 3) is performed immediately following LSB programming (step 64 of FIG. 3). This scheme reduces the need for buffering data in the memory controller or in the memory device. On the other hand, this scheme may be sub-optimal with respect to interference reduction, because it may apply large threshold voltage changes in the two word lines while neighboring word lines are not yet programmed.

In alternative embodiments, after performing LSB programming in a given pair of word lines, the HMSB programming in these word lines is postponed until one or more other neighboring word lines are LSB-programmed. This scheme reduces interference between word lines, but may require buffering of the HMSB data (the third data page to be stored using HMSB programming).

Storage at a Non-Integer Number of Bits Per Memory Cell Using Half-Page Granularity In some embodiments, system 20 stores data in memory device 24 at a granularity of half a page. The system may choose to store either half a page or a full page of data in a given word line, depending on the amount of data that is already stored in this word line, and on the amount of data that is buffered and pending for storage. The buffered data may be buffered in any suitable buffer memory (not shown) in memory controller 40 and/or memory device 24.

In these embodiments, when preparing to store data in a given word line, the system assesses the data size that is already stored in the word line (e.g., none, half a page, a full page or 1.5 pages) and the data size that is buffered for storage (e.g., half a page or a full page). The system chooses an appropriate programming operation, from among a set of predefined programming operations, based on these two assessments. In particular, as will be shown below, at least one of the predefined storage operations programs a full page of data into a word line that currently holds half a page.

In the description that follows, the terms "a word line holding half a page" and "a word line programmed with Half-LSB (HLSB)" are used interchangeably, the terms "a word line holding a full page" and "a LSB-programmed word line" are used interchangeably, and the terms "a word line holding 1.5 pages" and "a word line programmed with LSB+HMSB" are used interchangeably.

Storing data in this manner enables considerable flexibility in applying alternating programming orders among word lines, in order to reduce interference. For example, the disclosed technique can be used for storing data in a memory device in which the programming order of word lines is pre-dictated. At the same time, the disclosed technique reduces the buffer size used for buffering the data that is pending for storage.

Figure 5:
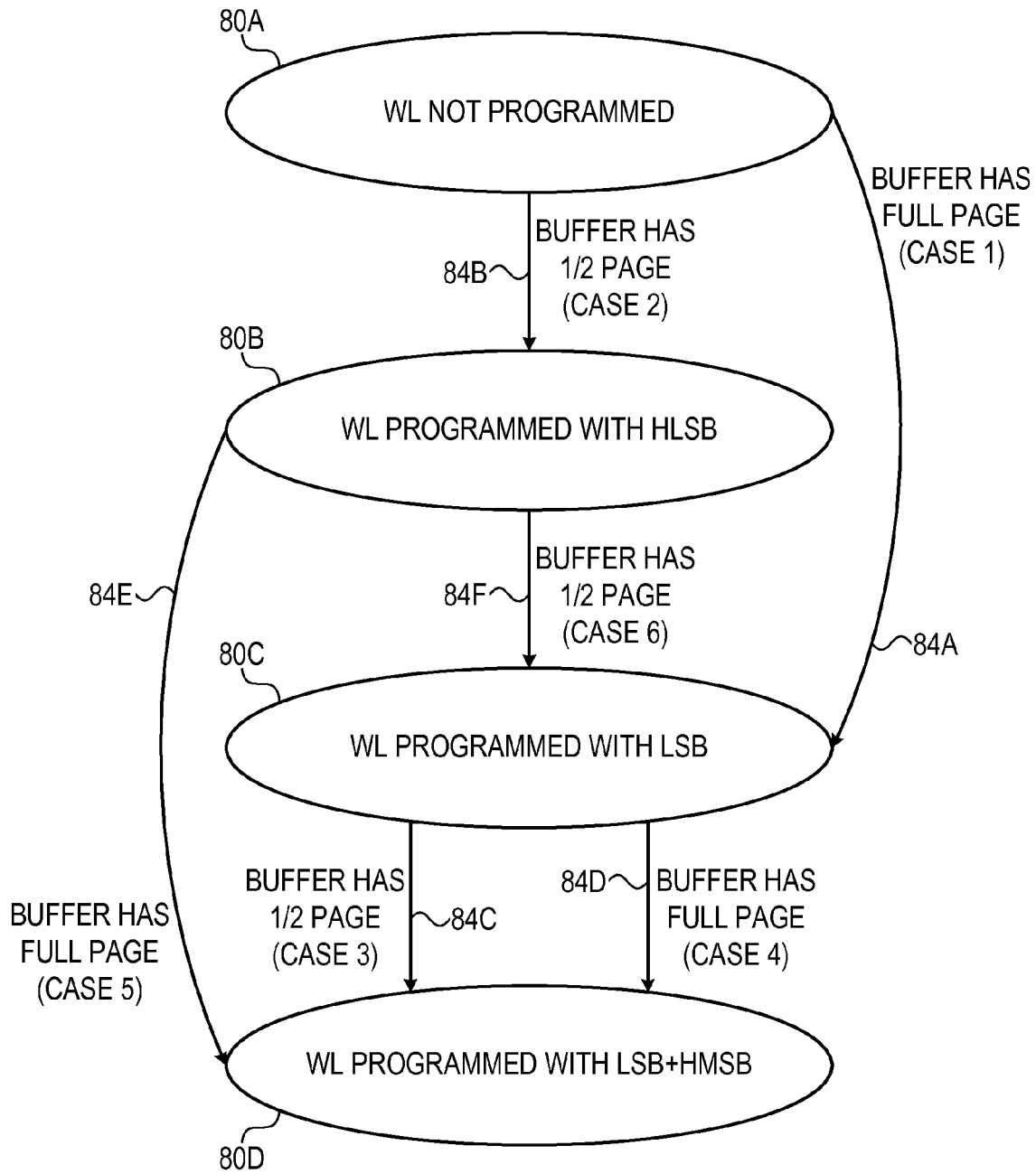
FIG. 5 is a state diagram that schematically illustrates a process of storing data across multiple word lines, in accordance with an embodiment of the present invention.

FIG. 5 is a state diagram that schematically illustrates a process of storing data using a non-integer number of bits per memory cell across multiple word lines, in accordance with an embodiment of the present invention. According to the state model of FIG. 5, a given word line may be in one of four states denoted 80A . . . 80D. States 80A . . . 80D correspond to the four possible data sizes that may already be stored in the memory cells of the word line: None, half a page, a full page, and 1.5 pages, respectively.

Six state transitions denoted 84A . . . 84F are defined between the states. Each transition corresponds to a respective programming operation that programs the memory cells of the word line from a certain state to another state. When preparing to store data in a given word line, system 20 checks the amount of data that the word line already holds i.e., determines the current state of the word line. Based on the amount of data that is buffered for storage, the system chooses the appropriate state transition, i.e., the appropriate programming operation.

In the example embodiment of FIG. 5, the system chooses the programming operation from a set of six possible programming operations that correspond to six cases, in accordance with the following table:

| Case # | Current WL state | Size of buffered data |
|---|---|---|
| 1 | 80A - not programmed | Full page |
| 2 | 80A - not programmed | Half page |
| 3 | 80C - holds full page | Half page |
| 4 | 80C - holds full page | Full page |
| 5 | 80B - holds Half a page | Full page |
| 6 | 80B - holds Half a page | Half page |

In case 1 (transition 84A), system 20 stores a full page of data in the word line using LSB programming. The word line at this stage is referred to as LSB programmed, i.e., at state 80C.

In case 2 (transition 84B), system 20 stores half a page into the un-programmed word line. In an example embodiment, the system stores the half page by applying LSB programming to half of the memory cells in the word line, while half of the memory cells remain un-programmed. The system may choose which memory cells to program at this stage in any desired manner, such as a physically contiguous half of the word line (e.g., first or last 50% of the memory cells in the word line), the odd-order memory cells, the even-order memory cells, or any other suitable subset that includes half of the memory cells. The choice of memory cells may have an effect on the level and predictability of cell-to-cell interference. The word line at this stage is referred to as HLSB programmed, i.e., at state 80B.

Typically, each memory cell in the subset that is programmed in case 2 is paired with a respective memory cell that is not programmed. The use of this pairing will be explained below. In an embodiment, the programming operation of case 2 sets the programming levels of the memory cells in a given pair according to the following table:

| HLSB value | Programming levels |
|---|---|
| "0" | L0, L0 |
| "1" | L0, L1 | wherein L0 and L1 refer to the programming levels shown in FIG. 2 above.

In case 3 (transition 84C), the word line already holds a full page, i.e., it is LSB programmed. The system stores an additional half a page (HMSB) in this word line, resulting in a word line that is LSB+HMSB programmed, i.e., reaching state 80D. In an embodiment, the programming operation of case 3 programs an additional bit into each pair of LSB-programmed memory cells in the word line. In an example embodiment, the programming operation of case 3 sets the programming levels of the memory cells in a given pair according to the following table:

| | HMSB value | |
|---|---|---|
| Current LSB values | "0" | "1" |
| "00" | L0, L0 | L0, L2 |
| "01" | L0, L1 | L2, L1 |
| "10" | L1, L0 | L2, L0 |
| "11" | L1, L1 | L1, L2 |

For example, if a given pair of memory cells is programmed to "0" and "1" LSB values, respectively, and the HMSB value to be programmed is "1", then the programming operation of case 3 will program the pair of memory cells to programming levels L2, L1, respectively.

In case 4 (transition 84D), the word line already holds a full page, i.e., it is LSB programmed, and an additional full page is buffered for storage. In this case, the system programs half of the buffered page in the given word line (resulting in a LSB+HMSB programmed word line). The system programs the other half of the buffered page in another word line, e.g., the next word line in the array. In an embodiment, the programming operation of case 4 programs half a page in the given word line using the programming operation of case 3 above. The other half page is programmed in the other word line depending on the state of that other word line, e.g., using the programming operation of case 2, 3 or 6.

In case 5 (transition 84E), the given word line already holds half a page (HLSB programmed). The system stores an additional full page (MSB) in this word line on top of the existing half page. In accordance with the above-described embodiment, the memory cells of the HLSB-programmed word line are paired. Within each pair, one memory cell is LSB-programmed and the other memory cell is un-programmed. In an embodiment, the programming operation of case 5 stores two additional bits in each such pair of memory cells.

In one embodiment, the programming operation of case 5 sets the programming levels of the memory cells in a given pair according to the following table:

| | MSB values | | | |
|---|---|---|---|---|
| Current programming levels | "00" | "01" | "10" | "11" |
| L0, L0 | L0, L0 | L2, L0 | L1, L0 | L0, L2 |
| L0, L1 | L0, L1 | L0, L2 | L1, L1 | L1, L2 |

The programming operation of case 5 programs each pair of memory cells, one of which is un-programmed and the other LSB-programmed, to eight possible levels. Thus, after the programming operation of case 5, each pair of memory cells holds three bits. For example, if the pair of cells was at programming levels L0, L1, and the new bits to be stored are both "1", then the programming operation sets the pair of memory cells to programming levels L1, L2, respectively.

In case 6 (transition 84F), the word line already holds half a page (HLSB programmed). The system stores another half page in this word line, resulting in a LSB-programmed word line. The programming operation of case 6 may program the additional half page in various manners. In one embodiment, the memory cells in the HLSB-programmed word line are paired. In each pair, one memory cell is LSB-programmed and the other is un-programmed (e.g., following programming using case 2 above). In this embodiment, the programming operation of case 6 stores a bit in each un-programmed memory cell by applying LSB programming.

In an alternative embodiment, the new half page can be buffered until another half page is accepted for storage from host 52. Then, the two half pages are stored using the programming operation of case 5 above. This scheme may be advantageous since it reduces the wearing of the word line by programming it once instead of twice. Further alternatively, the mapping of bit values to programming levels can be defined such that case 6 does not occur.

The above-described state model, mapping tables and programming operations are shown purely by way of example. In alternative embodiments, any other suitable programming scheme can be used. Consider, for example, the cases where a certain page is split into two halves and each half stored in a different word line. In such a case, the page can be split in an interleaved manner, such that the odd-order bits are stored in one word line and the even-order bits are stored in another word line. Splitting the page in this manner simplifies the readout process, and in particular combining the read data from the two word lines in order to reconstruct the original page.

In an example embodiment, bits 1,3,5,7, . . . of the original page are respectively stored in the pairs of memory cells [1,2], [3,4], [5,6], [7,8] . . . of one word line. Bits 2,4,6,8, . . . of the original page are stored in the pairs of memory cells [1,2], [3,4], [5,6], [7,8] . . . of another word line.

As another example, consider the embodiments in which the memory cells in a given word line are paired, and a mapping is defined for storing data in each pair. In some embodiments, the roles of the memory cells within each pair are swapped from time to time, in order to balance the stress and wearing of the memory cells. In one embodiment, role swapping in a given memory block is carried out each time the memory block is erased. Alternatively, role swapping can be performed at any other suitable time.

Storage at a Non-Integer Number of Bits Per Memory Cell by Splitting a Partial Subset of the Programming Levels In some embodiments, system 20 stores data in a group of analog memory cells, e.g., a word line, in two programming phases. In the first phase, the system programs the memory cells in the group to a certain predefined set of initial programming levels. The number of initial programming levels is typically an integer power of two, e.g., two or four programming levels.

In a second programming phase, additional data is stored in the group, but only in the memory cells that were programmed to a predefined partial subset of the initial programming levels. The second programming phase sets at least some of these memory cells to additional programming levels that are different from the initial programming levels.

In other words, a certain subset of the initial programming levels is pre-designated for splitting into additional programming levels in order to store additional data. In the second programming phase, the system identifies the memory cells in the group that are programmed to this subset of programming levels, and programs only these memory cells with the additional data.

Note that the data size stored in the second phase is smaller than the data size stored in the second phase, since the second phase programs only a selected part of the memory cells in the group.

Typically, the total number of programming levels after the second programming phase, i.e., the aggregate number of the initial and additional programming levels, is not an integer power of two. Example schemes that reach an aggregate number of three, five, six, seven and nine programming levels are described below. Thus, these two-phase storage schemes store data at a non-integer number of bits per memory cell.

Figure 6:
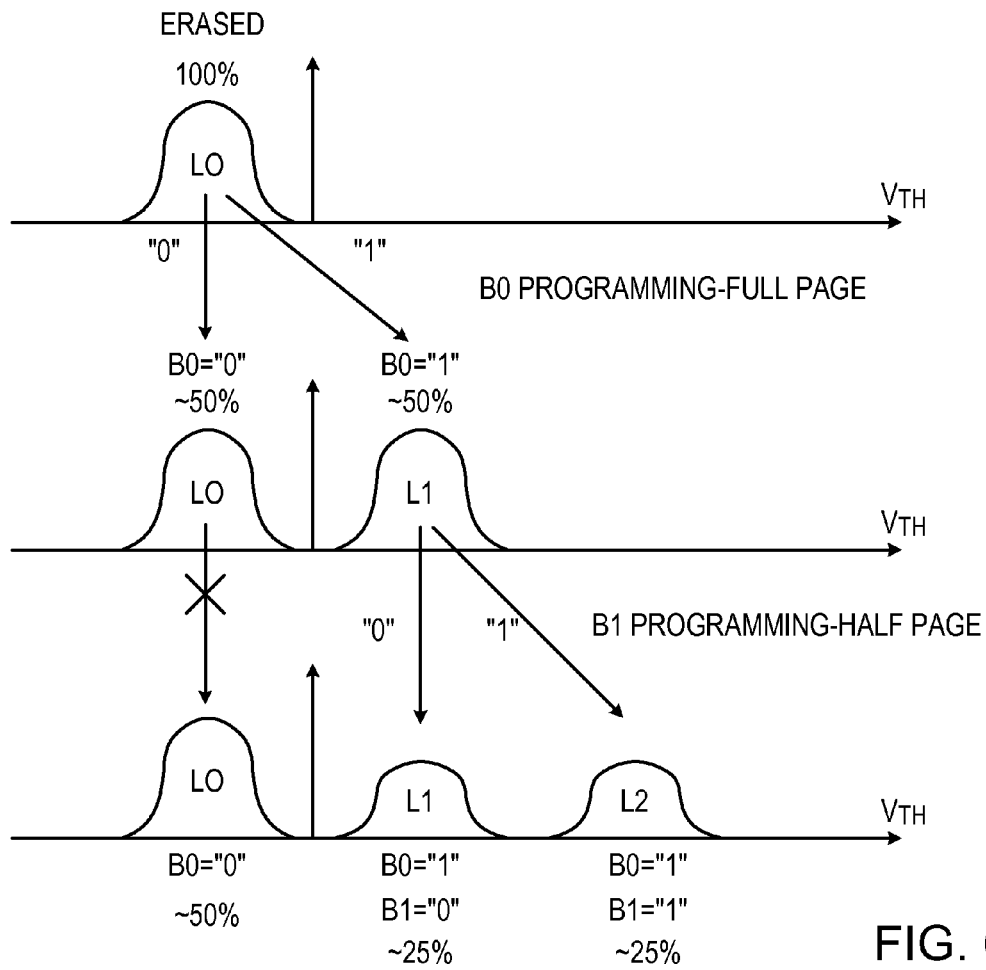
FIG. 6 is a graph showing a process of storing data using a non-integer number of bits per memory cell, in accordance with another embodiment of the present invention.

FIG. 6 is a graph showing data storage using the above-described two-phase process, in accordance with an example embodiment of the present invention. The top graph in FIG. 6 shows the threshold voltage distribution in a group of memory cells (e.g., a word line) before storage begins. At this stage, all the memory cells in the group are erased, i.e., set to level L0.

In the first programming phase, a full page of data denoted B0 is programmed into the memory cells in the group, one bit per memory cell. The middle graph in FIG. 6 shows the threshold voltage distribution in the group after this phase. In the present example, a B0="0" bit value is stored in a given memory cell by setting (retaining) the memory cell at programming level L0. A B0="1" bit value is stored by programming the memory cell to programming level L1.

In the second programming phase, the system identifies the memory cells that were programmed in the first phase to programming level L1, and stores an additional half-page (denoted B1) in these memory cells. The memory cells that were programmed in the first phase to programming level L0 are not programmed in the second phase.

The system stores half-page B1 by programming some of the memory cells of programming level L1 to programming level L2, and retaining the other memory cells of level L1 without additional programming. In the present example, the system stores a B1="1" bit value in a given memory cell (that is currently at level L1) by programming the memory cell to level L2. A B1="0" bit value is stored by retaining the memory cell at level L1.

The bottom graph in FIG. 6 shows the threshold voltage distribution in the group after the second programming phase. Typically, approximately 50% of the memory cells are at level L0, approximately 25% are at level L1, and approximately 25% are at level L2. At this stage, the group of memory cells holds 1.5 pages (B0 and B1) at an average storage density of 1.5 bits/cell.

The two-phase programming scheme of FIG. 6 achieves high capacity by enabling storage at a non-integer number of bits per memory cell. This scheme can also achieve good interference cancellation, because it can be applied in any suitable programming order of word lines, and requires only modest buffering. Thus, in some embodiments the system programs at least one neighboring word line after performing the first programming phase, and performs the second programming phase only after the neighboring word line is at least partially programmed.

In the present example, programming level L1 is pre-designated for splitting, and the second programming phase splits this level into levels L1 and L2. In alternative embodiments, however, any other programming level can be pre-designated for splitting. For example, the first programming phase may program the memory cells to levels L0 and L2, and the second programming phase may then program the memory cells of L0 into L0 and L1. Further alternatively, the first programming phase may program the memory cells to levels L0 and L1, and the second programming phase may then program the memory cells of L0 into L0 and L2.

In alternative embodiments, the disclosed two-phase process can be implemented, mutatis mutandis, using any suitable number of initial and additional programming levels. Several example variations of this scheme using various numbers of programming levels (and thus various storage capacities) are described further below.

Referring to the example of FIG. 6, after the first programming phase, approximately 50% of the memory cells are at programming level L0 and approximately 50% of the memory cells are at programming level L1. In some embodiments, for example, the data is scrambled before storage and the scrambling operation causes an approximate even distribution of "0" and "1" bit values. This 50%/50% distribution, however, is only approximate, and the actual percentages of "0" and "1" bit values may vary from one page to another.

The approximate distribution may be problematic for implementing the second programming phase. As noted above, the B1 half-page is stored only in the memory cells that are at level L1. Because of the approximate distribution, however, the number of these memory cells is not constant. If, for example, the number of memory cells at level L1 happens to be lower than 50%, the number of memory cells at level L1 may be insufficient for storing the B1 half-page.

In some embodiments, system 20 avoids situations of this sort by pre-processing the data of the B0 page before it is stored in the first programming phase.

The pre-processing ensures that at least 50% of the memory cells in the group will be programmed to level L1 in the first programming phase. When this condition is met, the number of memory cells in level L1 is sufficient for storing the B1 half-page in the second programming phase.

(For a general number of programming levels, the pre-processing ensures that at least a predefined percentage of the memory cells in the group will be programmed in the first programming phase to the subset of the programming levels that are subsequently used for storing additional data in the second programming phase. This predefined percentage typically corresponds to the data size stored in the second phase.)

System 20 may apply any suitable kind of pre-processing to cause at least 50% of the memory cells in the group will be programmed to level L1. In an example embodiment, the system counts the number of bits in the B0 page that are to be mapped to level L1 (in the example of FIG. 6—the number of B0="1" bit values). If this number is smaller than 50% of the page size (equivalent to 50% of the number of memory cells in the group), the system inverts the data values of the B0 page. After inversion, the number of bit values that are to be mapped to level L1 is at least 50%. The system then carries out the two-phase storage process of FIG. 6.

Typically, for each group of memory cells, system 20 stores a respective indication of whether the bits of the B0 page were inverted or not before storage. The indication is referred to herein as an "inversion bit." The system may store the inversion bit in any suitable manner and at any suitable location, either in the same group of memory cells or in another storage location. Typically, the system stores the inversion bit using a highly reliable storage configuration, since an error in reading the inversion bit affects the entire data readout. When subsequently reading the B0 page from the group of memory cells, the system queries the inversion bit and, if necessary, inverts the read B0 bit values in order to reconstruct the data correctly.

In some embodiments, the system encodes the B0 page with an Error Correction Code (ECC) before storage. Typically, the pre-processing (e.g., counting of B0="1" bit values and bit inversion) should be applied to the bits of the ECC code words after ECC encoding, i.e., to the actual encoded bits that will be stored in the memory cells. In these embodiments, the inversion bit is produced after ECC encoding, and is therefore not protected by the ECC. System 20 may solve this issue, for example, by encoding the inversion bit with a separate ECC. The inversion bit can then be stored in a suitable storage location, typically outside the group of memory cells.

Alternatively to using an inversion bit, the system may designate a certain bit within the B0 page (before ECC encoding) and maintain this bit at a fixed predefined bit value (e.g., "0"). This bit is encoded with ECC together with the other bits of the B0 page. The system counts the number of "1" bit values in the encoded bits, and, if necessary, inverts the bit values in the entire code word. The system then carries out the storage process of FIG. 6. During data readout, following ECC decoding, if the designated bit is found to be "1" (i.e., the inverse of the fixed predefined bit value), the system concludes that the entire B0 page has been bit-wise inverted, and inverts all the B0 bit values. In this embodiment, the ECC is assumed to have the property that the bit-wise inverse of any code word is also a valid code word.

In yet another embodiment, the system applies pre-processing only to the data bits before ECC encoding and not to the parity bits added by the ECC. Since the number of parity bits is typically small relative to the overall page size, the inaccuracy of this scheme is often tolerable. In still another embodiment, the system checks whether the number of memory cells in level L1 is sufficient for storing the B1 half-page in the second programming phase. If not, the system does not program the B1 half-page in this group of memory cells, and proceeds to program the next group (e.g., the next word line).

In another embodiment, the system may scramble the data with different scrambler seeds until successfully causing at least 50% of the B0 page memory cells to be programmed to level L1. In another embodiment, the B1 half-page size can be defined as less than 50% of the full page size, in order to increase the probability of success. Generally, a trade-off exists between the size of the B1 half page and the probability of success in programming it. the smaller the size of the B1 half page, the higher the probability of success.

In yet another example embodiment, the system chooses whether to program the B1 half page into the memory cells that were programmed to level L0, or into the memory cells that were programmed to level L1. The system then stores an indication of this choice for subsequent decoding.

Figure 7:
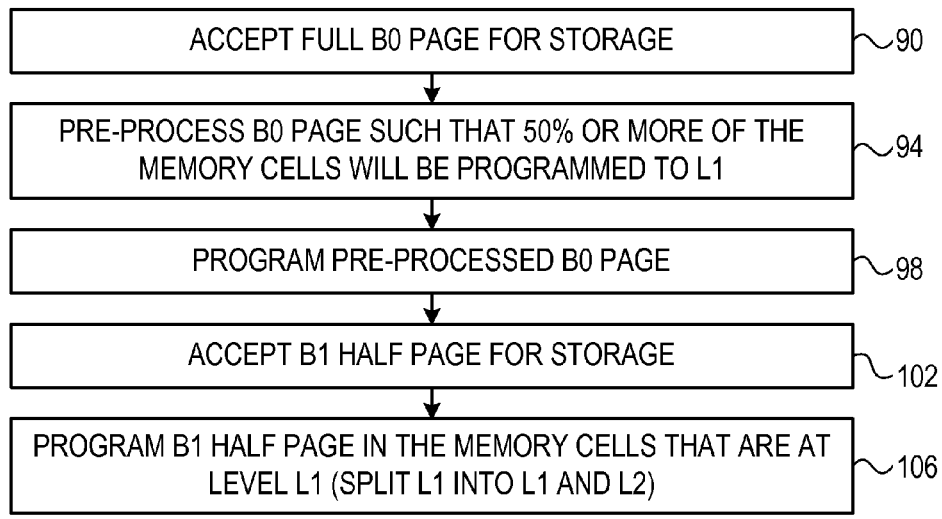
FIG. 7 is a flow chart that schematically illustrates a method for data storage using a non-integer number of bits per memory cell, in accordance with an embodiment of the present invention.

FIG. 7 is a flow chart that schematically illustrates a method for data storage using the two-phase process of FIG. 6 above, in accordance with an embodiment of the present invention. The method begins with system 20 accepting a full page (B0) for storage, at a first input step 90. The system pre-processes the B0 page, at a pre-processing step 94, such that at least 50% of the B0 bits will be programmed to programming level L1 in the first programming phase. The system programs the pre-processed B0 page, at a first phase programming step 98.

The system accepts a half page (B1) for storage, at a second input step 102. (This step is shown after step 98 for the sake of clarity. In alternative embodiments, the system may accept the B1 half page at any suitable time, e.g., together with accepting the B0 page at step 90.) The system identifies the memory cells that were programmed to level L1 in the first programming phase (step 98), and programs the B1 half page in the identified memory cells, at a second phase programming step 106.

Consider a group of memory cells that was programmed with a B0 page and a B1 half page to levels L0, L1 and L2. The threshold voltage distribution in this group is shown in the bottom graph of FIG. 6 above. In some embodiments, system 20 reads the B0 page from these memory cells by comparing the cell threshold values to a read threshold that is positioned between levels L0 and L1. For example, this read threshold can be positioned at or near 0V.

In order to read the B1 half page, the system should first identify the memory cells in which the bits of the B1 half page are stored, and then read the B1 half page from the identified memory cells. In the present example, the B1 half page is stored in the memory cells that were programmed to level L1 in the first programming phase, i.e., the memory cells for which the B0 bit is "1". Thus, in some embodiments, the system identifies the memory cells holding the B1 half page based on the read results of the B0 page.

Readout of the B0 page, however, typically involves some error probability. Any error in reading a bit of the B0 page will cause an error in identifying the memory cells that hold the B1 half page: Erroneously reading "0" instead of "1" in the B0 page will miss a memory cell that holds a bit of the B1 half page. Erroneously reading "1" instead of "0" in the B0 page will erroneously identify a memory cell as holding a bit of the B1 half page. Events of this sort will cause erroneous insertion and deletion of bits, rather than bit value errors, in the B1 half page. Such insertion and deletion errors are typically complicated to correct, and should be avoided.

For example, in some embodiments system 20 applies ECC decoding to the read B0 page before using the read results to identify the memory cells that hold the bits of the B1 half page. By using the error-corrected read results of the B0 page, the memory cells holding the B1 half page are identified with improved reliability, and the probability of introducing insertion or deletion errors is considerably reduced.

Figure 8:
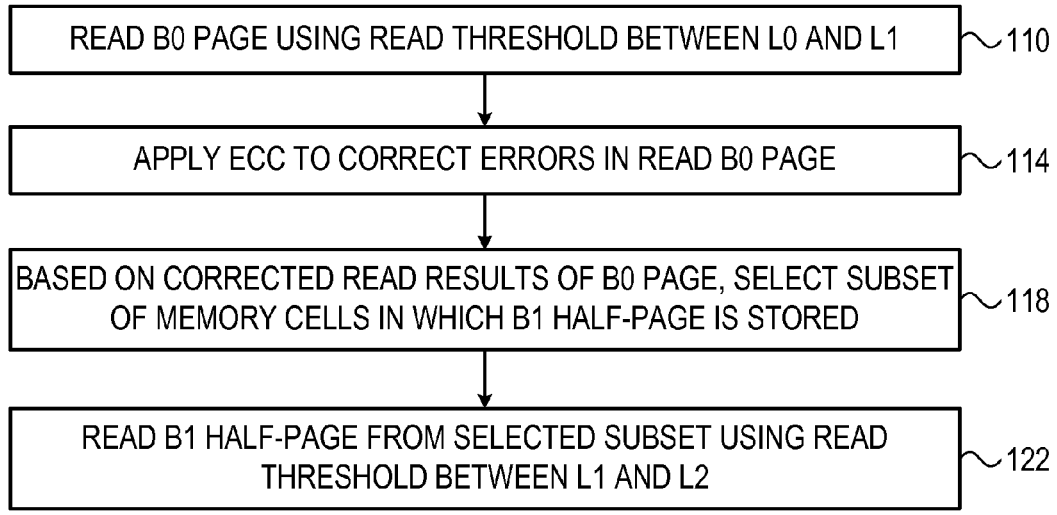
FIG. 8 is a flow chart that schematically illustrates a method for readout of data that is stored using a non-integer number of bits per memory cell, in accordance with an embodiment of the present invention.

FIG. 8 is a flow chart that schematically illustrates a method for readout of data that was stored using the process of FIG. 7 above, in accordance with an embodiment of the present invention. The method begins with system 20 reading the B0 page, at a first readout step 110. This readout step may be carried out in response to a request to retrieve the B0 page, or in preparation for retrieving the B1 half page. The system reads the B0 page by setting a read threshold in the boundary region between levels L0 and L1 (e.g., at or near 0V), and comparing the cell threshold voltages to the read threshold.

The system corrects read errors in the read B0 page by decoding the ECC, at an error correction step 114. Based on the error-corrected read results of the B0 page, the system selects the subset of memory cells in which the B1 half page is stored, at a cell selection step 118. For the example of FIG. 6 above, the system selects the memory cells for which the B0 bit value is "1".

The system then reads the B1 half page from the selected subset of memory cells, at a second readout step 122. The system reads the B1 half page by setting a read threshold in the boundary region between levels L1 and L2, and comparing the cell threshold voltages to the read threshold.

The two-phase programming scheme of FIG. 6 above can be generalized in a straightforward manner to any desired number of initial and additional programming levels. In the first programming phase, the memory cells are programmed to a certain set of initial programming levels. In the second programming phase, one or more of the initial programming levels are split, so as to produce respective additional programming levels.

In some embodiments, the second programming phase (e.g., programming of level L2 in the example of FIG. 6) can be used for marking memory cells that suffer from high distortion. Distortion may comprise, for example, disturb noise, stuck cell values that cause programming failure, over-programming or any other kind of distortion. When the system identifies a certain cell as suffering from high distortion (e.g., during programming verification), the system programs one of the memory cells in the vicinity of the distorted cell using the second programming phase. The vicinity is defined because not every memory cell can be programmed in the second programming phase. The programmed cell may belong to the same word line as the distorted cell or to another word line.

During data readout, the cell that was programmed using the second programming phase is detected, and the system regards all the memory cells in the vicinity of this cell as potentially less reliable. In an example embodiment, the vicinity of a given cell is defined as a separation of up to thirty-two memory cells from the given cell along the same word line. Alternatively, any other suitable vicinity can be defined.

Consider, for example, a row of memory cells that are programmed in a first programming phase to four programming levels denoted L0 . . . L3: {L0 L1 L3 L2 L0 L0 L1 L2 X L1 L2 L2 L2 L2 L3}. In this example, the memory cell marked with X suffers from high distortion. Assuming that a second programming phase programs the memory cells from level L3 to a new level L4, a subsequent memory cell can be programmed to L4 in order to mark this distortion. In this example, the programming levels after the second programming phase are {L0 L1 L3 L2 L0 L0 L1 L2 X L1 L2 L2 L2 L2 L4}. The marked cell is separated by five memory cells from the distorted cell. During readout, the cell programmed to L4 is identified, and the thirty-two cells preceding it are regarded as less reliable.

Figure 9:
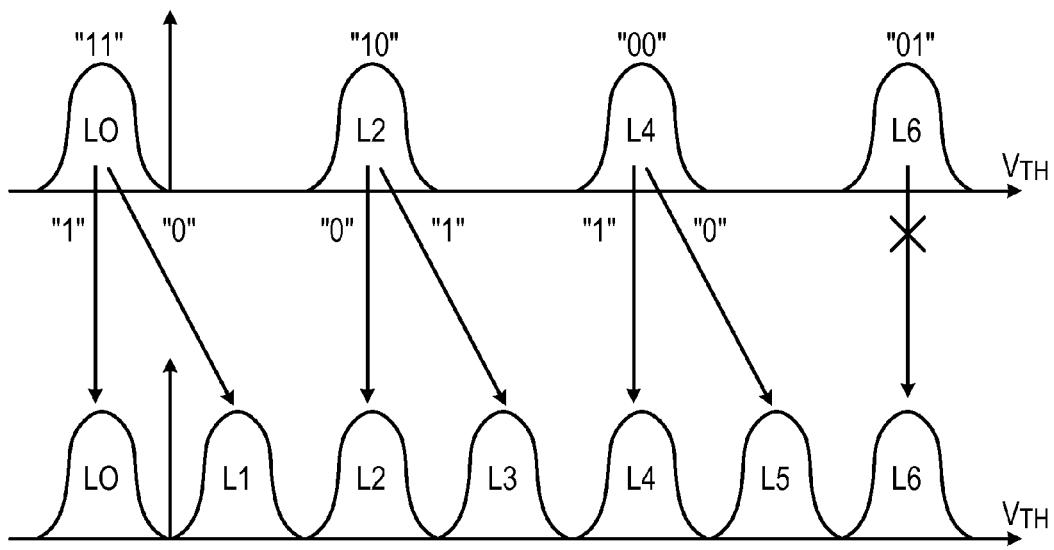
FIG. 9 is a graph showing a process of storing data using a non-integer number of bits per memory cell, in accordance with yet another embodiment of the present invention.

FIG. 9 is a graph showing a two-phase data storage process, in accordance with an embodiment of the present invention. In the present example, the memory cells are initially programmed with two pages, to four programming levels denoted L0, L2, L4 and L6. At this stage the average storage density is 2 bits/cell.

In the second programming phase, only the memory cells belonging to three of the four levels (L0, L2 and L4) are programmed with an additional bit. The data size stored in the second programming phase is ¾ of a page. Thus, levels L0, L2 and L4 are split to produce additional programming levels L1, L3 and L5, respectively. The memory cells belonging to level L6 are not programmed in the second programming phase. The second programming phase stores an additional data bit in 75% of the memory cells. The two-phase storage process thus produces seven programming levels, and the achieved average storage density is 2.75 bits/cell. This density is very close to the theoretical upper bound of $\log_2(7)=2.81$ bits/cell.

In order to guarantee a sufficient number of memory cells for the second programming phase, the pre-processing stage typically ensures that at least 75% of the memory cells will be programmed to level L0, L2 and L4. This condition can be met by using two inversion bits, one inversion bit for each of the pages stored in the first programming phase. (In an example pre-processing scheme, the first page is pre-processed using one inversion bit such that no more than 50% of the memory cells will be programmed to L4 and L6. This result is possible since after the first page is programmed, there are two voltage states, one corresponding to "0" bits of the $1^{st}$ programmed page and the other to "1" bits. When the second page is programmed, the lower voltage state splits into L0 and L2 and the higher state splits into L4 and L6. Therefore, it is enough to ensure that no more than 50% of the bits of the $1^{st}$ programmed page will be mapped to the higher state in order to make sure that no more than 50% of the memory cells will be programmed to L4 and L6. The second page is pre-processed using another inversion bit such that no more than 25% of the memory cells will be programmed to L6. This result is possible since during the programming of the $2^{nd}$ page, the higher voltage state is split into L4 and L6 according to the data bits of the $2^{nd}$ page, and therefore it is enough to ensure that no more than 50% of the data bits of the $2^{nd}$ page that cause splitting of the higher state will cause a split to L6.) The system may read the ¾ page that was stored in the second programming phase using ECC-corrected read results of the other two pages, generalizing the method of FIG. 8 above.

In some embodiments, mapping of bit values to programming levels in the seven-level scheme can be defined using Gray mapping. The mapping scheme of FIG. 9, for example, meets this condition as shown in the following table:

| Level | LSB of first phase | MSB of first phase | ¾ page of second phase |
|---|---|---|---|
| L0 | "1" | "1" | "1" |
| L1 | "1" | "1" | "0" |
| L2 | "1" | "0" | "0" |
| L3 | "1" | "0" | "1" |
| L4 | "0" | "0" | "1" |
| L5 | "0" | "0" | "0" |
| L6 | "0" | "1" | N/A |

In some embodiments, R/W unit 36 of memory device 24 comprises internal logic that performs LSB and MSB programming using four programming levels. This logic typically comprises two page buffers for holding the LSB page and MSB page to be programmed. In some embodiments, this logic can be used for implementing the seven-level programming schemes described above. In particular, this logic can be used to implement the second programming phase in which three out of four programming levels are split, so as to produce a total of seven final programming levels.

When performing MSB programming, the internal logic in the R/W unit typically sets for each memory cells one of three programming verification thresholds ("PV levels") depending on the LSB value and MSB value to be written into that cell. By appropriate setting of the bit values in the two page buffers and of the three PV levels, the system can cause the internal logic to carry out the splitting operation of the second programming phase. This action assumes that the system has access to the two page buffers.

In an example embodiment, the R/W unit carries out MSB programming in accordance with the following table:

| LSB value | MSB value | PV level |
|---|---|---|
| "1" | "1" | N/A |
| "1" | "0" | PV0 |
| "0" | "0" | PV1 |
| "0" | "1" | PV2 |

In order to use this mechanism to implement the second programming phase described above, the system sets the PV levels and the bit values in the LSB and MSB page buffers such that the R/W unit will carry out the desired programming, i.e., split each of programming levels L0, L2 and L4 in two (FIG. 9). For example, for memory cells that should not be programmed in the second phase, the LSB and MSB values are set to "1".

Consider, for example, a scheme in which the first programming phase programs levels L0, L1, L3 and L5. The second programming phase splits levels L1, L3 and L5 to produce levels L2, L4 and L6, respectively. In this example embodiment, the system may implement the second programming phase by setting the following bit values in the LSB and MSB page buffers:

| Desired programming level | LSB value | MSB value |
|---|---|---|
| L0 (already programmed) | "1" | "1" |
| L1 (already programmed) | "1" | "1" |
| L2 | "1" | "0" |
| L3 (already programmed) | "1" | "1" |
| L4 | "0" | "0" |
| L5 (already programmed) | "1" | "1" |
| L6 | "0" | "1" |

In these embodiments, readout of the LSB and MSB data (which was programmed in the first programming phase) can be carried out using three read thresholds—One for reading the LSB data and two for reading the MSB data. The additional data written in the second programming phase is typically read using additional read thresholds and logical operations on the read bits.

The embodiments of FIG. 9 above referred to a scheme that produces seven programming levels. The disclosed technique, however, can be used for producing other numbers of programming levels that are not an integer power of two. For example, the system may store data at an average density of 2.5 bits/cell using a total of six programming levels. This density is very close to the theoretical upper bound of $Log_2(6)=2.59$ bits/cell.

In such a scheme, the first programming phase stores two pages in four initial programming levels. In the second programming phase, two of these levels are split to produce two additional programming levels. Thus, the second programming phase stores an additional half page. For pre-processing in this scheme, a single inversion bit is sufficient: If the levels that are split during the $2^{nd}$ programming phase have bit mappings (after the $1^{st}$ phase, i.e., after two pages are programmed) having one bit in common, then only this bit needs to be monitored. For example, if the split is applied to levels whose initial mapping is "01" and "00", then it is necessary to monitor only the left-hand-side bit and ensure that more than 50% of the cells will have this bit as "0". If the split is from states "10" and "00", it is necessary to monitor the right-hand-side bit. However, if the split is from "01" and "10" (which have no bit in common), then one inversion bit is not sufficient and two inversion bits are needed.

As yet another example, the system may store data at an average density of 2.25 bits/cell using a total of five programming levels. This density is close to the theoretical upper bound of $Log_2(5)=2.32$ bits/cell. In such a scheme, the first programming phase stores two pages in four initial programming levels. In the second programming phase, one of these levels is split to produce one additional programming level. Thus, the second programming phase stores an additional ¼ page. Pre-processing in this scheme typically uses two single inversion bits.

As still another example, the system may store data at an average density of 3.125 bits/cell using a total of nine programming levels. This density is very close to the theoretical upper bound of $\log_2(9)=3.17$ bits/cell. In such a scheme, the first programming phase stores three pages in eight initial programming levels. In the second programming phase, one of these levels is split to produce one additional programming level. Thus, the second programming phase stores an additional ⅛ page.

In the embodiments of FIGS. 6-9, the system programs a partial subset of the memory cells in the final programming phase, whereas all the preceding phases program all the memory cells in the group. This choice, however, is made purely by way of example. In alternative embodiments, the system may program a partial subset of the memory cells at any of the programming phases, followed by one or more subsequent programming phases that program all the memory cells in the group. Any such scheme can be used for achieving a number of final programming levels that is not an integer power of two.

The programming schemes of FIGS. 6-9 are advantageous, for example, because they enable the system to use Gray mapping of bit value combinations to programming levels (i.e., mapping in which neighboring programming levels differ by only a single bit value). Gray mapping is often difficult or impossible to achieve in known schemes that use a number of programming levels that is not an integer power of two.

Additional Embodiments and Variations

FIG. 4 above illustrates an example programming scheme that stores data at a density of 1.5 bits per cell by storing three bits in a pair of memory cells, each memory cell having three possible programming levels. The following description gives an alternative way of storing three bits in a pair of memory cells. This alternative scheme uses four possible programming levels for each memory cell, but permits only a partial subset of the sixteen possible combinations of programming levels in the two cells.

FIG. 10 is a diagram that schematically illustrates a process of storing three data pages in memory cells belonging to two word lines, in accordance with an alternative embodiment of the present invention. In the present example, each of the two memory cells can be programmed to one of four possible programming levels denoted L0 . . . L3. One cell belongs to WL1 and the other belongs to WL2. The left-hand-side of FIG. 10 shows the two memory cells after LSB programming, i.e., after one memory page is stored in each WL. At this stage, each memory cell is programmed to either L0 or L2, according to the bit mapping shown in the figure. The resulting four combinations of programming levels in the two memory cells are marked with constellation points 130.

In this embodiment, an additional bit is then stored jointly in the two memory cells, and this stage is referred to as HMSB programming. In HMSB programming, each programming level in each memory cell is split into two programming levels, depending on the HMSB bit value. The programming levels of the two memory cells after LSB and HMSB programming are shown on the right-hand-side of the figure. The resulting eight combinations of programming levels in the two memory cells are marked with constellation points 134. Note that although each memory cell can be programmed to one of four possible levels (L0 . . . L3), only eight of the sixteen possible combinations of programming levels are used for LSB+HMSB programming. Thus, three bits (and not four) are stored in each pair of memory cells.

Assuming the voltage window (the difference between the highest to lowest threshold voltages) is normalized to unity, the minimal distance between constellation points 134 is $\sqrt{2}/3$. This minimal distance is slightly smaller than the minimal distance of ½ achieved by the scheme of FIG. 4. However, the scheme of FIG. 10 can be generalized to higher dimensions (larger number of memory cells) in a straightforward manner so as to achieve larger minimal distances.

For a group of n cells each having m possible programming levels, there are $m^n$ possible combinations of programming levels per group. The possible combinations can be diluted by a factor of two (i.e., using only half of the combinations) so as to increase the minimal distance by a factor of $\sqrt{2}$. This kind of dilution can be applied recursively (i.e., the constellation can be further diluted by a factor of two to gain another factor of $\sqrt{2}$ in minimal distance, and so on).

The dilution can be performed in any suitable manner. Example dilution schemes are described by Wei, in "Trellis-Coded Modulation with Multidimensional Constellations," IEEE Transactions on Information Theory, volume IT-33, no. 4, July, 1987, pages 483-501, which is incorporated herein by reference. This technique can be used, for example, for mapping five pages to 3 WLs, so as to achieve a storage density of ~1.67 bits/cell, using four possible programming levels per cell. This mapping is achieved by diluting the original $4^5$-point constellation by a factor of four and increasing the minimal distance by a factor of two.

As another example, seven pages can be mapped to four WLs (achieving a storage density of ~1.75 bits/cell) by diluting the original $4^7$-point constellation by a factor of eight and increasing the minimal distance by a factor of $2\sqrt{2}$. As can be seen from these examples, the disclosed technique allows flexibility in choosing storage densities in the range [1.5 2], which may be difficult to achieve using the approach of FIG. 4.

The "level splitting" programming schemes described above focused on splitting programming levels individually for each memory cell in a second programming phase. This approach can be generalized to groups of two or more memory cells, for which the combinations of programming levels are split. Let the term "multi-state" refer to the joint programming level of a group of memory cells, i.e., the combination or vector of programming levels of the memory cells in the group.

In this generalized scheme, a group of memory cells is programmed in a first programming phase to one of several initial multi-states. In a second programming phase, only a partial subset of the initial multi-states are split, to produce additional multi-states that are different from the initial multi-states. The total number of multi-states (initial and additional multi-states) following the second programming phase is typically not an integer power of two. The initial multi-states, the partial subset of the initial multi-states to be split, and the additional multi-states, are defined jointly for the multiple memory cells in the group.

Figure 11:
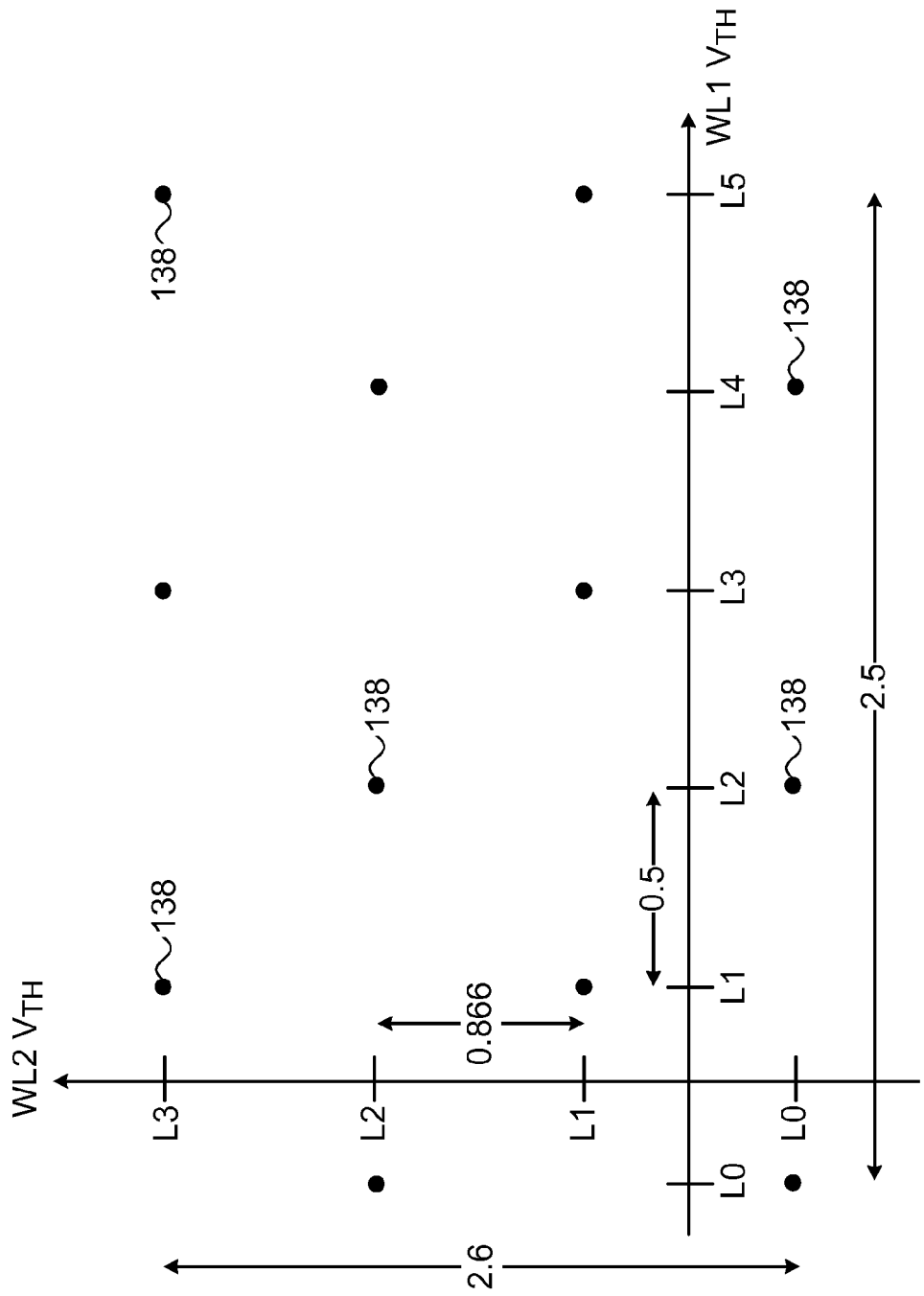
FIG. 11 is a graph showing storage of data using a non-integer number of bits per memory cell, in accordance with another embodiment of the present invention.

FIG. 11 is a graph showing storage of data using a non-integer number of bits per memory cell, in accordance with an embodiment of the present invention. In the present example, a first memory cell in WL1 is programmable to one of six programming levels denoted L0 ... L5, and a second memory cell in WL2 is programmable to one of four programming levels denoted L0 ... L3. The same process is applied to the other pairs of memory cells along WL1 and WL2.

In the first programming phase, three bits are stored in each pair of memory cells by programming the pair of cells to eight initial multi-states (some of which may not belong to the final set of multi-states). In the second programming phase, an additional half page is stored in each pair of cells by splitting four of the eight initial multi-states in two. The second programming phase results in a total of twelve final multi-states (out of the twenty four possible combinations of programming levels in the two cells). In the present example, the final multi-states of the pair of memory cells are marked in the figure with constellation points 138. Alternatively, any other suitable multi-state constellation can be used.

Splitting multi-states of multiple cells enables higher flexibility in choosing the desired storage density, in comparison with splitting programming levels of individual cells. In the example of FIG. 11, each pair of memory cells holds 3.5 bits, i.e., a storage density of 1.75 bits/cell. This approach can be extended to higher dimensions (larger groups of memory cells) in a straightforward manner. For a given dimension, the constellation of final multi-states can be chosen, for example, as the constellation that has the highest minimum distance between constellation points, such as an optimal lattice. Lattices of this sort are described, for example, by Conway and Sloane, in "Sphere Packings, Lattices and Groups," Springer, New York, third edition, 1998, chapter 4, pages 94-131, which is incorporated herein by reference. The two-dimensional 12-point constellation of FIG. 11, for example, is derived from a two-dimensional hexagonal lattice that is shown on page 110 of this book. Alternatively, the constellation of final multi-states can be chosen using any other suitable criterion.

Some of the embodiments described herein refer mainly to system 20 or to memory controller 40 as carrying out the disclosed techniques. This choice, however, is made purely by way of example. Alternatively, the disclosed techniques can be carried out by R/W unit 36 in the memory device, or jointly by the memory controller and R/W unit. Any suitable partitioning of functions between the memory controller and the R/W unit can be used.

Although the embodiments described herein mainly address storage applications, the methods and systems described herein can also be used in other applications, such as in communication systems. For example, when using Pulse Amplitude Modulation (PAM) or Quadrature Amplitude Modulation (QAM), the disclosed techniques can be used for mapping bits to symbols in a communication packet or message, for a constellation whose size is not an integer power of two.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. An apparatus, comprising:
a memory including a plurality of multi-level cells for data storage;
storage circuitry coupled to the memory, wherein the storage circuitry is configured to:
receive data for storage in the memory;
store the received data in one or more of the plurality of multi-level cells using one or more programming levels of a plurality of programming levels;
determine that at least a first multi-level cell is subject to distortion; and
program a second multi-level cell with a predetermined programming level in response to determining the first multi-level cell is subject to distortion, wherein the predetermined programming level is different than each programming level of the plurality of programming levels, wherein the predetermined programming level is indicative that the first multi-level cell is subject to distortion.

2. The apparatus of claim 1, wherein the plurality of multi-level cells is arranged in a plurality of rows, wherein each row of the plurality of rows is associated with a respective word line.

3. The apparatus according to claim 2, wherein the second multi-level cell is associated with a common wordline associated with the first multi-level cell.

4. The apparatus according to claim 2, wherein the second multi-level cell is associated with another wordline, adjacent to a wordline associated with the first multi-level cell.

5. The apparatus according to claim 1, wherein the storage circuitry is further configured to utilize the predetermined programming level to program one or more selected multi-level cells, including the second multi-level cell, solely to indicate that one or more associated multi-level cells, including the first multi-level cell, is subject to distortion.

6. The apparatus according to claim 1, wherein the distortion includes disturb noise from multi-level cells adjacent to the first multi-level cell.

7. The apparatus according to claim 1, wherein to determine that at least the first multi-level cell is subject to distortion, the storage circuitry is further configured to determine that at least the first multi-level cell is stuck at a given programming level.

8. A method for data storage, comprising:
receiving data for storage in a memory, wherein the memory includes a plurality of multi-level cells for data storage;
storing the received data in one or more multi-level cells using one or more programming levels of a plurality of programming levels;
determining at least a first multi-level cell is subject to distortion; and
programming a second multi-level cell with a predetermined programming level responsive to determining the first multi-level cell is subject to distortion, wherein the predetermined programming level is different than each programming level of the plurality of programming levels, wherein the predetermined programming level is indicative that the first multi-level cell is subject to distortion.

9. The method according to claim 8, wherein the plurality of multi-level cells is arranged in a plurality of rows, wherein each row of the plurality of rows is associated with a respective word lines.

10. The method according to claim 9, wherein the second multi-level cell is associated with a common wordline associated with the first multi-level cell.

11. The method according to claim 9, wherein the second multi-level cell is associated with another wordline, adjacent to a wordline associated with the first multi-level cell.

12. The method according to claim 8, further comprising utilizing the predetermined programming level to program one or more selected multi-level cells, including the second multi-level cell, solely to indicate that one or more associated multi-level cells, including the first multi-level cell, is subject to distortion.

13. The method according to claim 8, wherein determining that at least the first multi-level cell is subject to distortion comprises determining that at least the first multi-level cell is stuck at a given programming level.

14. The method according to claim 8, wherein distortion includes over-programming of the first multi-level cell.

15. A system comprising:
   a memory device including a plurality of multi-level cells for data storage, wherein the plurality of multi-level cells is arranged in a plurality of rows, and wherein each row of the plurality of rows is associated with a respective word line; and
   a host configured to send data for storage in the memory device;
   wherein the memory device is configured to:
      receive the data for storage in one or more of the plurality of multi-level cells;
      store the received data in the one or more of the plurality of multi-level cells using one or more programming levels of a plurality of programming levels; and
      program a second multi-level cell with a predetermined programming level responsive to determining a first multi-level cell is subject to distortion, wherein the predetermined programming level is different than each programming level of the plurality of programming levels, wherein the predetermined programming level is indicative that the first multi-level cell is subject to distortion.

16. The system according to claim 15, wherein the second multi-level cell is associated with a common wordline associated with the first multi-level cell.

17. The system according to claim 15, wherein the second multi-level cell is associated with another wordline, adjacent to a wordline associated with the first multi-level cell.

18. The system according to claim 15, wherein the memory device is further configured to utilize the predetermined programming level to program one or more selected multi-level cells, including the second multi-level cell, solely to indicate that one or more associated multi-level cells, including the first multi-level cell, is subject to distortion.

19. The system according to claim 15, wherein distortion includes over-programming of the first multi-level cell.

20. The system according to claim 15, wherein to determine that at least the first multi-level cell is subject to distortion, the memory device is further configured to determine that at least the first multi-level cell is stuck at a given programming level.

* * * * *